United States Patent [19]

Barnett et al.

[11] Patent Number: 5,308,746
[45] Date of Patent: May 3, 1994

[54] SILVER IMAGE BLEACHING SOLUTION AND PROCESS

[75] Inventors: Anthony M. Barnett, Bushey; Colin J. Gray; Jeffrey K. Green, both of Harrow; David A. Hallbery, Wembley; Julie Baker, Rickmansworth, all of United Kingdom

[73] Assignee: Eastman Kodak Company, Rochester, N.Y.

[21] Appl. No.: 39,376

[22] PCT Filed: Aug. 18, 1992

[86] PCT No.: PCT/EP92/01883
§ 371 Date: Apr. 20, 1993
§ 102(e) Date: Apr. 20, 1993

[87] PCT Pub. No.: WO93/04401
PCT Pub. Date: Mar. 4, 1993

[30] Foreign Application Priority Data

Aug. 21, 1991 [GB] United Kingdom ............ 9118042

[51] Int. Cl.⁵ ............................................. G03C 5/00
[52] U.S. Cl. ................................... 430/331; 430/205; 430/302
[58] Field of Search .............. 430/205, 302, 309, 325, 430/331, 430, 431

[56] References Cited

U.S. PATENT DOCUMENTS 4,258,122  3/1981  Uchida et al. ............... 430/253
4,746,597  5/1988  Zellmer et al. .............. 430/331
4,837,122  6/1989  Kondo et al. ................ 430/204

FOREIGN PATENT DOCUMENTS 97282    1/1984  European Pat. Off. .
231028   8/1987  European Pat. Off. .
2107889A 5/1983  United Kingdom .
3600     4/1990  World Int. Prop. O. .

Primary Examiner—Hoa Van Le
Attorney, Agent, or Firm—Alfred P. Lorenzo

[57] ABSTRACT

A deletion fluid for use with lithographic printing plates comprising a silver image formed by the silver salt diffusion transfer process is comprised of an aqueous solution containing iodine, an iodide salt and a surfactant which comprises both polyalkyleneoxy units and a quaternary ammonium group.

6 Claims, No Drawings

SILVER IMAGE BLEACHING SOLUTION AND PROCESS

This invention relates to a method of bleaching silver images and to solutions therefor.

The photographic silver salt diffusion transfer image forming process is well known. It is also well known that lithographic printing plates can be formed by this process and such printing plates can be formed on a metal, polymeric film or paper base. Sometimes it is desirable to retouch the silver image formed thereby and, specifically, it is sometimes desired to remove parts of the image such as unwanted cut lines and spots.

It is known, for example from British specification 2 107 889 that a thickened solution containing, for example, iodine and an iodide can achieve the desired result. When such a deletion solution is used with a litho plate that has been treated with a litho plate conditioner which contains phenyl-mercapto-tetrazole and cetyl-trimethyl-ammonium bromide the results are unsatisfactory.

The present invention provides a method of removing silver images while avoiding the problem noted above.

According to the present invention there is provided a deletion fluid for lithographic printing plates comprising a silver image formed by the silver salt diffusion transfer process comprising an aqueous solution containing iodine and an iodide salt characterized in that it contains from 1 to 10% by weight of a surfactant which comprises both polyalkylenoxy units and a quaternary ammonium group.

The silver image to be treated may be on an imagewise exposed and processed printing plate made by the photographic silver salt diffusion transfer process. Such materials are described in Research Disclosure Item 308119, December 1989 published by Kenneth Mason Publications, Emsworth, Hants, United Kingdom.

The deletion fluid may be applied to the silver image either before or after the image has been treated with a conditioner to make the silver oleophilic. Preferably it is applied before the conditioner because if it is applied afterwards, it will usually be necessary to wipe the plate with a conditioner-dampened pad to achieve the best deletion effect.

The alkyleneoxy groups may, for example, be ethyleneoxy or propyleneoxy groups. The surfactant molecule may comprise one or more ethyleneoxy chains having a total of 5 to 25 units, preferably 10 to 20 units. The quaternary ammonium group may have one or more alkyl substitutents having from 1 to 18 carbon atoms, typically such groups being derived from natural products are a mixture.

The surfactant preferably has the general formula:

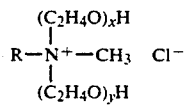

wherein x+y = from 10 to 20, and

R is an alkyl group having from 10 to 18 carbon atoms or represents a mixture thereof. The preferred compounds have groups R having predominantly 12 and/or 15 carbon atoms.

An example of such a surfactant is ETHOQUAD C25 (Trademark of Akzo Chemie).

The deletion solution preferably contains a mixture of water and butyrolactone. The ratio of aqueous to organic solvent is optimized to provide sufficient water for rapid penetration of the solute into the gelatin layer (if present) on the image-bearing material, together with sufficient butyrolactone to obtain high complexing power for silver iodide so that the image is removed in a conveniently quick time. It may also contain other solvents used alone or in combination including alcohols eg ethyl or butyl alcohol.

The iodide may be provided by an ammonium or alkali metal iodide, eg sodium or potassium iodide.

The deletion solution preferably contains from 2 to 50 g, especially from 2 g to 20 g, of iodine and from 50 g to 250 g, especially from 150 g to 200 g, of iodide ions per liter of solution. The solvent preferably comprises from 10 to 60% by weight of water.

Preferably the solution also contains an acid, for example acetic acid, preferably in an amount of from 10 to 30, preferably 15 to 25, g/1 of 90% acetic acid.

The following Example is included for a better understanding of the invention. The words KODAK, PMT, IMAGEMAKER, IMAGEMATE, ROTAPRINT, KLUCEL and SURFONYL are trademarks.

EXAMPLE

The following deletion solution was made up:

| Deletion Fluid | |
|---|---|
| Iodine | 8.8 g |
| Potassium iodide | 176.7 g |
| Butyrolactone | 856.4 g |
| Hydroxypropyl cellulose (KLUCEL H) | 6.7 g |
| Acetic acid (90% w/w) | 20.0 g |
| ETHOQUAD C25 (surfactant) | 62.9 g |
| Water to | 1.0 liter |

A control deletion fluid was also made being of the same formula as above but without the ETHOQUAD C25.

Images were produced using Kodak PMT3 KNP negative paper, exposed on a Kodak Imagemaker Camera and processed in a Kodak 43DT Imagemate Processor onto Kodak PMT II Paper Litho Plate receivers. Part of the area on one plate was then deleted with the Deletion Fluid of the invention while the same area on another plate was deleted using the control solution. Both plates were then conditioned using a conditioner of the composition:

| Conditioner | |
|---|---|
| Sodium ferric EDTA | 40.0 g |
| Phenylmercaptotetrazole | 2.8 g |
| ETHOQUAD C25 | 6.0 g |
| Acetic acid 90% w/w | 20.0 ml |
| Cetyltrimethyl ammonium bromide | 1.5 g |
| Potassium iodide | 5.5 g |
| Potassium thiocyanate | 1.0 g |
| Sodium acetate to | pH4 |
| Water to | 1.0 liter |

The plates were mounted side by side on a Rotaprint R3550 press and printing started. During the run the supply of fount solution to the plates was switched off and the plates allowed to scum for 30 seconds before resuming normal operation.

The plate treated using the deletion fluid of the invention gave clean printed results just like an untreated plate both before and after the scumming. The plate containing the deletion made with the control deletion fluid displayed incomplete deletion both before and after scumming.

When the deletion fluid was applied after the conditioner, a less good effect was achieved but this could be improved by wiping the plate with a conditioner-damp pad.

We claim:

1. A deletion fluid for lithographic printing plates comprising a silver image formed by the silver salt diffusion transfer process, said deletion fluid comprising an aqueous solution containing 2 to 50 grams per liter of iodine, 50 to 250 grams per liter of iodide ions and from 1 to 10% by weight of a surfactant which comprises both polyalkyleneoxy units selected from ethylenoxy and propyleneoxy units and a quaternary ammonium group.

2. A deletion fluid as claimed in claim 1, in which the surfactant molecule comprises one or more ethyleneoxy chains having a total of from 5 to 25 ethyleneoxy units.

3. A deletion fluid as claimed in claim 2, in which the surfactant molecule comprises a total of 10 to 20 ethyleneoxy units.

4. A deletion fluid as claimed in claim 1, in which the surfactant's quaternary ammonium group has one or more alkyl substituents having 1 to 18 carbon atoms or represents a mixture thereof.

5. A deletion fluid as claimed in claim 1, additionally containing butyrolactone.

6. A deletion fluid as claimed in claim 5, which comprises from 10 to 60% by weight of water.

* * * * *